(12) United States Patent
Shiang et al.

(10) Patent No.: US 6,703,780 B2
(45) Date of Patent: Mar. 9, 2004

(54) ORGANIC ELECTROLUMINESCENT DEVICE WITH A CERAMIC OUTPUT COUPLER AND METHOD OF MAKING THE SAME

(75) Inventors: Joseph John Shiang, Niskayuna, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 301 days.

(21) Appl. No.: 09/760,150

(22) Filed: Jan. 16, 2001

(65) Prior Publication Data

US 2004/0027062 A1 Feb. 12, 2004

(51) Int. Cl.$^7$ ................................................. H01J 63/04
(52) U.S. Cl. ...................................................... 313/504
(58) Field of Search ................................ 313/503, 504, 313/505, 506, 502

(56) References Cited

U.S. PATENT DOCUMENTS

| | | | |
|---|---|---|---|
| 5,294,870 A | | 3/1994 | Tang et al. ................. 313/504 |
| 5,313,325 A | * | 5/1994 | Lauf et al. .................. 359/614 |
| 5,644,327 A | * | 7/1997 | Onyskevych et al. ......... 345/80 |
| 5,708,130 A | | 1/1998 | Woo et al. ................... 528/397 |
| 5,831,699 A | * | 11/1998 | Wright et al. ................ 349/73 |
| 5,900,381 A | | 5/1999 | Lou et al. ..................... 501/54 |
| 5,955,837 A | | 9/1999 | Horikx et al. |
| 6,208,077 B1 | * | 3/2001 | Hung .......................... 313/506 |
| 6,388,375 B1 | * | 5/2002 | Pinckney et al. ........... 313/493 |
| 6,429,585 B1 | * | 8/2002 | Kitazume et al. ........... 313/505 |
| 6,521,360 B2 | * | 2/2003 | Lee et al. .................... 428/690 |

FOREIGN PATENT DOCUMENTS

EP 0 969 699 A1 7/1999 ........... H05B/33/02

OTHER PUBLICATIONS

Lai et al., "Improved External Efficiency of Light Emitting Diode Using Organic Thin Film," CLEO Conference Proceedings, Pacific Rim 99, WL6, pp. 246–247 (1999).

Gu et al., "High–External–Quantum–Efficiency Organic Light–Emitting Devices," Optics Letters 6, vol. 22, pp. 396–398 (1997).

Gerrit Klarner et al., "Colorfast Blue Light Emitting Random Copolymers Derived from Di–n–hexylfluorene and Anthracene", 10 Adv. Mater. pp. 993–997 (1998).

Junji Kido et al., "Organic Electroluminescent Devices Based on Molecularly Doped Polymers", 61 Appl. Phys. Lett. pp. 761–763 (1992).

Chung–Chih Wu et al., "Efficient Organic Electroluminescent Devices Using Single–Layer Doped Polymer Thin Films with Bipolar Carrier Transport Abilities", 44 IEEE Trans. On Elec. Devices, pp. 1269–1282 (1997).

A. W. Grice et al., "High Brightness and Efficiency of Blue Light–Emitting Polymer Diodes", 73 Appl. Phys. Letters, pp. 629–631 (1998).

Hiroyuki Suzuki et al., "Near–ultraviolet Electroluminescence from Polysilanes", 331 Thin Solid Films, pp. 64–70 (1998).

P.S. Mudgett et al., "Multiple Scattering Calculations for Technology," 10 Appl. Optics, pp. 1485–1502 (1971).

(List continued on next page.)

Primary Examiner—Max Noori
(74) Attorney, Agent, or Firm—Toan P. Vo; Patrick K. Patnode

(57) ABSTRACT

An organic light emitting diode containing a first electrode, a second electrode, at least one organic light emitting layer, and a ceramic output coupler is provided. The index of refraction of the output coupler is matched to that of the adjacent layer of the device. The ceramic output coupler may be a ceramic substrate with a dimpled light emitting surface which reduces Fresnel and critical angle optical losses.

31 Claims, 8 Drawing Sheets

OTHER PUBLICATIONS

Madigan et al., "Improvement of Output Coupling Efficiency of Organic Light–Emitting Diodes by Backside Substrate Modification," Applied Physics Letters, vol. 76, No. 13, pp. 1650–1652 (2000).

Carr, "Photometric Figures of Merit for Semiconductor Luminescent Sources Operating in Spontaneous Mode," Infrared Physics, Vol 6, pp. 1–19 (1966).

Schnitzer et al., "30% External Quantum Efficiency from Surface Textured, Thin–Film Light–Emitting Diodes," Appl. Phys. Lett. 63 (16), pp. 2174–2176 (1993).

Crawford et al., "Light–Emitting Diodes," Encyclopedia of Applied Physics, vol. 8, pp. 485–514 (1994).

* cited by examiner

ORGANIC ELECTROLUMINESCENT DEVICE WITH A CERAMIC OUTPUT COUPLER AND METHOD OF MAKING THE SAME

BACKGROUND OF THE INVENTION

The present invention relates generally to lighting devices and more particularly to an organic light emitting diode.

Organic electroluminescent devices, such as organic light emitting diodes (OLEDs), are currently used for display applications and are planned for use in general lighting applications. An OLED device includes one or more organic light emitting layers disposed between two electrodes, e.g., a cathode and a light transmissive anode, formed on a light transmissive substrate. The organic light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine to form excited molecules or excitons. The excited molecules or excitons emit light when they decay.

However, the external quantum efficiency of OLEDs, which is defined as a ratio of the photons emitted by the device to the number of injected electrons is lower than desired. There have been prior attempts to improve the external quantum efficiency of OLEDs by increasing the number of light beams that strike the substrate/air interface at an angle less than the critical angle.

For example Lai et al. (CLEO Conference Proceedings, Pacific Rim 99, WL6, pages 246–47 (1999)) suggests texturing the bottom light emitting surface of a glass substrate (i.e., the surface distal from the OLED device). The textured surface enables more light rays from the organic light emitting layer to strike the substrate/air interface at an angle smaller than the critical angle, thus allowing more light rays to escape from the substrate.

Furthermore, Madigan et al., 76 Appl. Phys. Lett. 13, 1650 (2000), incorporated herein by reference, have suggested placing a glass, silicone or epoxy lens array over a glass or polycarbonate substrate to reduce critical angle loss. Since the lens array has the same or similar index of refraction as the substrate, the loss at the substrate/array interface is minimized. However, the index of refraction of the glass and polycarbonate substrates (n=1.51 and 1.59, respectively), is significantly lower than the index of refraction of the adjacent indium tin oxide (ITO) anode layer (n≈1.8). Therefore, the OLED of Madigan et al. suffers from a large loss at the ITO/substrate interface due to the large index of refraction mismatch between these materials.

Therefore, despite the efforts, the external quantum efficiency of OLEDs, such as those of Lai et al. and Madigan et al., is still lower than desirable. The present invention is directed to overcoming or at least reducing the problem set forth above.

BRIEF SUMMARY OF THE INVENTION

In accordance with one aspect of the present invention, there is provided an organic electroluminescent light emitting device, comprising a first electrode, a second electrode, at least one organic light emitting layer, and a ceramic output coupler.

In accordance with another aspect of the present invention, there is provided an organic electroluminescent light emitting device, comprising a first electrode, at least one organic light emitting layer over the first electrode, a second transparent electrode over the at least one organic light emitting layer, and a shaped ceramic material over the second transparent electrode, wherein the shaped ceramic material contains a corrugated or dimpled light emitting surface and voids throughout its volume which scatter light emitted by the organic light emitting layer, and an index of refraction of the shaped ceramic material is matched to an index of refraction of an adjacent layer of the electroluminescent device.

In accordance with another aspect of the present invention, there is provided a method of making an organic electroluminescent light emitting device, comprising forming a first electrode, forming at least one organic light emitting layer, forming a second electrode, and forming a ceramic output coupler.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

Figure 1:
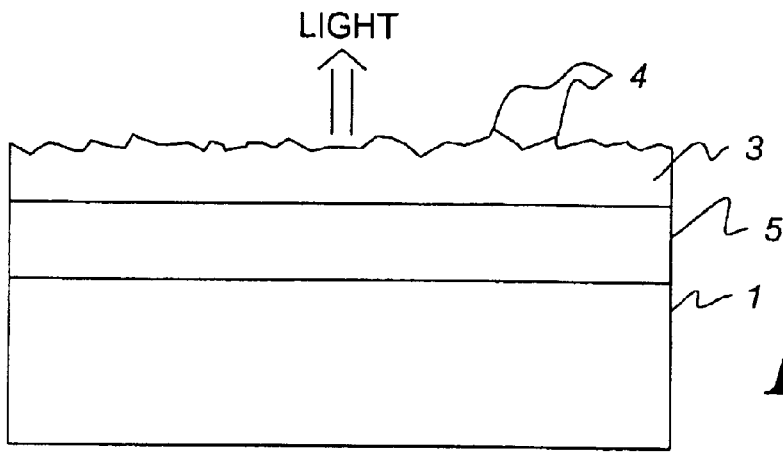
FIGS. 1–3 are drawings of an organic light emitting device containing an output coupler according to the first, second and third preferred embodiments of the invention.

The present inventors have realized that, by using a ceramic output coupler, the OLED quantum efficiency may be improved compared to using the glass or plastic substrate with a textured surface or lens array, such as that of Lai et al. and Madigan et al. A ceramic material may be manufactured with a desired amount of translucency and void content. The voids in the volume of a ceramic material act as random light scatterers. Thus, any light (the term "light" in the LED art customarily includes visible light, UV and IR radiation) emitted by the organic light emitting layer is randomly scattered by the voids in the ceramic material. Thus, the critical angle loss is reduced by the entire volume of the ceramic material rather than by just the surface of the textured glass or plastic substrate of the prior art. While fairly effective surface patterning schemes may be used for glass or plastic substrates, these schemes are complex and difficult to fabricate with high precision. In contrast, the ceramic material which provides volume scattering is highly effective and is simple to fabricate. Furthermore, the ceramic output coupler may be used as the substrate of the OLED device, eliminating the glass or plastic substrate. Since the index of refraction of the ceramic material can be tailored to match that of the transparent electrode (i.e., the ITO anode), the loss at the substrate/transparent electrode interface may be significantly reduced.

The external quantum efficiency of an organic electroluminescent device is typically much lower than its internal quantum efficiency due to the following factors: (i) the index of refraction mismatch between the device and the air into which the light is emitted, (ii) the index of refraction mismatch between the active device layers and the transparent substrate, and (iii) the critical angle loss resulting from a total internal reflection at the device/air interface. Hence, it is desirable to increase the external quantum efficiency so that it is as close as possible to the intrinsic internal quantum efficiency, especially for large area (e.g. >1 $cm^2$, such as about 1 $in^2$ to about 1 $ft^2$) organic electroluminescent devices.

The present inventors have recognized that the reasons for the reduction in external quantum can be expressed in terms of two mechanisms: a Fresnel loss and a critical angle loss. The Fresnel loss refers to the reduced transmission of light from the device (with index of refraction no) into the ambient medium or the transparent substrate (with index $n_2$) due to reflection at the boundary where there is an index of refraction mismatch between the device and the ambient medium or substrate. For normal incidence of light, the fraction $f_f$ of light that is transmitted from the device into the ambient medium or the substrate is given by the following equation:

$$f_f = \frac{4n_1 n_2}{(n_1 + n_2)^2} \quad (1)$$

Thus, as the difference in indices increases, the amount of light transmitted into the ambient medium or the substrate decreases. When the indices are equal, all of the light is transmitted. More complicated equations hold for other angles of incidence, but in all cases the trend of higher transmission with reduced index of refraction mismatch holds.

In most practical organic electroluminescent devices, the index of refraction of the ambient medium (e.g., air with index n=1) is less than that of the device and the substrate. In such cases, there is a critical angle loss which occurs due to total internal reflection at the device/air interface. In other words, only the light which is incident on the interface at an angle that is less than the critical angle is transmitted through the interface. The ratio $f_c$ of the light that gets transmitted through the interface relative to that which reaches the interface, assuming an isotropic angular distribution for the light, is given by the following equation.

$$f_c = 1 - \sqrt{1 - \left(\frac{n_2}{n_1}\right)^2} \quad (2)$$

Thus, as the index of refraction mismatch increases, the critical angle loss increases. Therefore, the magnitude of the critical angle is also dependent on the degree of the index mismatch.

The Output Coupler

The preferred aspects of the present invention provide an organic electroluminescent device containing a ceramic output coupler, which preferably comprises translucent ceramic material formed adjacent to the light emitting surface of the device. The ceramic material reduces an index of refraction mismatch between the electroluminescent device and the output coupler, which reduces the Fresnel loss and the critical angle loss at the device/coupler interface. In addition, the ceramic output coupler reduces the critical angle loss resulting from a total internal reflection at the device/air interface by providing a textured surface and/or light scattering voids. In a preferred aspect of the present invention, the electroluminescent device comprises an organic light emitting diode and the index of refraction of the output coupler is matched to an index of refraction of a layer adjacent (i.e., the outermost device layer, such as a transparent electrode or a transparent substrate) to the output coupler. For example, the index of refraction of the output coupler is the same as or close to an index of refraction of the adjacent layer of the electroluminescent device. In one preferred aspect of the present invention, an index of refraction of the output coupler which differs by less than 0.1, preferably by less than 0.01, from the index of refraction of the device is considered "matched to" or "close to" the index of refraction of the adjacent device layer.

In a first and second preferred embodiments of the present invention, the external quantum efficiency of a large area organic electroluminescent device is increased by attaching the ceramic output coupler onto the light emitting surface of the device. The output coupler can comprise any translucent or transparent ceramic material, which has a transmittance above 80%, preferably above 95%, most preferably above 99%. The transmittance of the ceramic material may be controlled by controlling the porosity of the ceramic material. For example, an alumina ceramic material has a transmittance above 95% if its void content is 0.1% and below and if its impurities are carefully controlled.

Furthermore, the index of refraction of the translucent or transparent ceramic output coupler material is preferably matched to or close to the index of refraction of the portion of the device to which it is attached. For example, if the ceramic material is attached to a glass or polymer substrate of the OLED device, then the index of refraction of the material is matched to that of the substrate. If the ceramic material is attached to an active layer of the organic electroluminescent device, such as a transparent (i.e., ITO) electrode or the organic light emitting layer, then the index of refraction of the ceramic material is matched to that of the active layer. Preferably, the ceramic material is selected from one or more of alumina ($Al_2O_3$), yttria ($Y_2O_3$), YAG ($Y_3Al_5O_{12}$), $MgAl_2O_4$, MgAlON, aluminum nitride (AlN), AlON, or titania ($TiO_2$) doped zirconia ($ZrO_2$). A portion of the elements of these materials may be substituted with dopants. For example, Mg dopant may be present in alumina, Sc or Ga dopants may be present in YAG and Y dopant may be added to zirconia to form yttrium stabilized zirconia (YSZ).

It is preferred that at least some voids are present in the entire volume of the ceramic material. The voids act as random scattering centers for the light emitted by the OLED, such that the randomly scattered light is incident on the light emitting surface of the output coupler at a broad range of angles. The light scattering voids decrease the critical angle loss at the output coupler/air interface by redirecting the light beams in plural directions. Thus, a higher portion of the scattered light will eventually be incident on the interface at an angle less than the critical angle.

In a preferred aspect of the present invention, the ceramic output coupler material is optionally shaped such that its top surface is modulated or textured, or has dimples or corrugations. The ceramic output coupler material may contain the dimples or corrugations in addition to or instead of the light scattering voids. The dimples or corrugations reduce the amount of light lost through total internal reflection due to the critical angle loss mechanism. Thus, the shaped ceramic material increases the external quantum efficiency of the device by reducing the critical angle losses at the device surface. Light paths that were previously internally reflected at the flat device surface can reach a side of a dimple or corrugation, perhaps even after a few internal reflections. This allows the light paths that strike the side of the dimple or corrugation to escape the device since their angle of incidence is now less than the critical angle with respect to the side or the dimple or corrugation. Thus, such a ceramic output coupler reduces the Fresnel loss and the critical angle loss at the device/coupler interface due to the index of refraction matching, and in addition also reduces the critical angle loss at the coupler/air interface due to the corrugated or iii dimpled surface and/or volume light scattering by the voids.

According to the first preferred embodiment of the present invention, the output coupler is attached to a completed organic electroluminescent device. This can be accomplished by attaching an output coupler comprising a shaped ceramic material 3 to the surface of the glass or polymer substrate 5 of the OLED 1, as shown in FIG. 1. The index of refraction of the output coupler 3 is close to or the same as that of the substrate 5. Preferably, the index of refraction of the output coupler 3 is the same as or greater than that of the substrate 5. Furthermore, while in a preferred aspect of the first embodiment the shaped transparent material 3 is attached to the substrate 5 after the OLED device 1 is formed on the substrate 5, the shaped transparent material 3 may be attached to the substrate 5 before the OLED device 1 is formed on the substrate 5.

Figure 3:
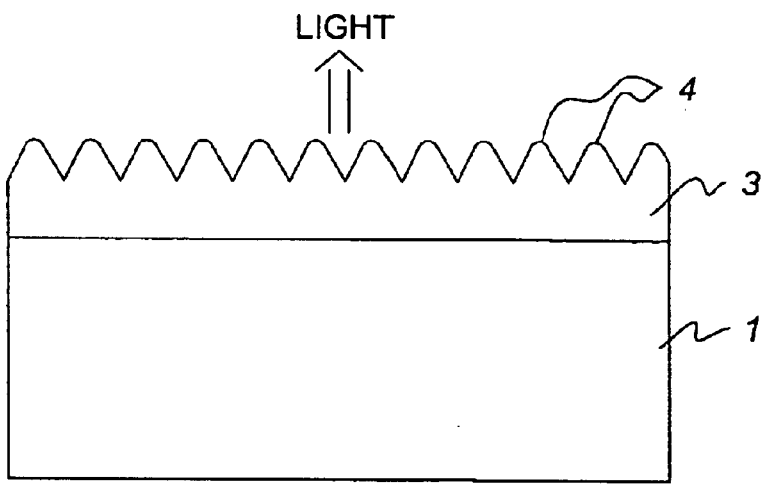

The light emitting surface of the ceramic material 3 preferably contains the dimples or corrugations 4 on the side from which light is emitted into the ambient environment. However, the dimples or corrugations 4 may be omitted if desired, and the light emitting surface of the ceramic material 3 may be flat. The shape of the material 3 to be attached is also preferably flat on the side of attachment. The height of the dimples or corrugations 4 is preferably greater than 0.1 micron, most preferably greater than 1 micron. Preferably the dimples or corrugations 4 cover the whole surface of material 3, but may cover only a portion of the surface of the material 3, such as the light emitting portion. The spacing between dimple or corrugation peaks is preferably within a factor of 10, most preferably within a factor of 5, of their height. The dimple or corrugation spacing and shape may conform to a regular pattern. For example, the dimples or corrugations 4 may have a regular spacing and a sinusoidal, pseudo-pyramidal or conical shape. For example, FIG. 3 illustrates dimples or corrugations 4 having a pseudo-pyramidal shape. However, the dimple spacing and/or shape does not have to conform to a regular pattern, and may be random.

Figure 2:
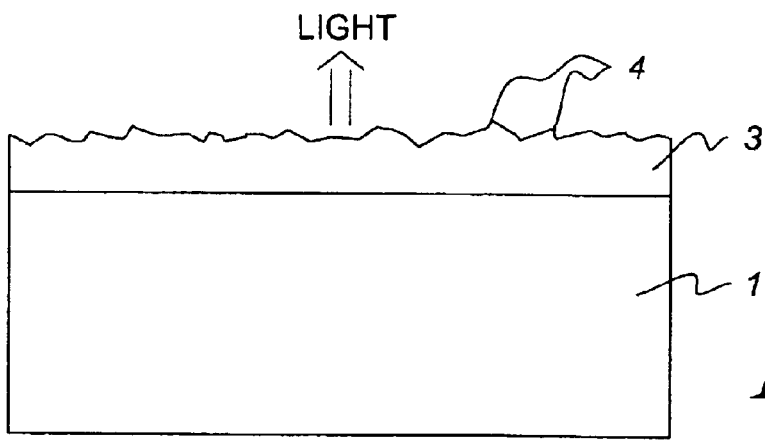

According to the second preferred embodiment of the present invention, the glass or polymer substrate 5 is omitted and the OLED device 1 is instead formed on the shaped ceramic material 3, as illustrated in FIG. 2. Thus, the glass or polymer substrate 5 of the organic electroluminescent device 1 is replaced with the shaped ceramic material substrate 3. The organic electroluminescent device 1 is fabricated onto the shaped ceramic material 3 rather than onto the glass or polymer substrate 5 as described in more detail below. Alternatively, the completed device 1 may be attached directly to the material 3, if the substrate 5 is omitted or located on the non-light emitting surface of the device 1. The substrate 5 may comprise materials other than transparent glass or polymer, such as metal or semiconductor, if it is located on the non-light emitting surface of the device 1.

In this embodiment, the index of refraction of the shaped ceramic material 3 is preferably matched to that of the adjacent layer of the organic electroluminescent device 1, rather than to the glass or polymer substrate 5. In other words, the index of refraction of the shaped ceramic material 3 is matched to the layer of the device 1 that contacts material 3, such as an ITO transparent electrode or the organic light emitting layer, depending on the layout of the device 1. The index of refraction of the material 3 may be matched to that of the device 1 by selecting a ceramic material 3 whose index of refraction matches that of the device, as described above. The index of refraction for some of these ceramic materials is provided in Table 1, below:

TABLE 1

| Ceramic Material | Index of Refraction |
| --- | --- |
| Yttria | 1.93 |
| Alumina | 1.77 |
| Spinel | 1.71 |
| YAG | 1.84 |
| AlON | 1.71 |

As can be seen from Table 1, the index of refraction of these materials is within 0.1 or less from the index of refraction of the ITO electrode, which has an index of refraction of about 1.8 to 2.05, depending on the ITO composition and deposition method. For the nearly fully dense, high purity substrates, the index of refraction does not depend significantly on the porosity of the trace additives used as sintering aids. If the substrate material, such as alumina, is birefringent, there will be some additional light scattering.

The omission of the substrate 5 in the second embodiment is advantageous because the external quantum efficiency of the device 1 of the second embodiment is greater than that of the first embodiment, when the index of refraction of the substrate 5 is not matched to that of the underlying active device layer, which causes critical angle and Fresnel losses at the device/substrate interface. Thus, the Fresnel and critical angle losses at the device 1/substrate 5 interface of the first embodiment are eliminated by eliminating the substrate 5.

The shaped transparent material 3 can be directly attached to the surface of the electroluminescent device 1 by using an adhesive or a mechanical clamp on the side surfaces of the material 3 and the device 1. Alternatively, a transparent adhesive, such as an epoxy, may be placed between the material 3 and the adjacent surface of the device 1. Suitable epoxies include the NOA 60, 61 and 81 epoxies from Norland Optical and the J91 epoxy from Summers Laboratories. Such epoxies generally have an index of refraction of about 1.55 to about 1.56. It is typically desirable that the epoxy have close to the same index of refraction as that of the device surface 1 and that of the ceramic material 3. This can be achieved by filling the epoxy with a specific amount of nanoparticles, such as titania, zinc oxide, alumina, silica, yttria, YAG, calcium carbonate, $BaSO_4$ or diamond particles having a mean particle diameter of 100 nm or less, preferably 50 nm or less.

According to the third preferred embodiment of the present invention, the ceramic output coupler 3 comprises a light emitting or phosphorescent ceramic material. The light emitting ceramic layer may be formed over a glass or plastic substrate 5, as illustrated in FIG. 1, or may be formed directly on the OLED 1, as illustrated in FIGS. 2 and 3. The light emitting ceramic layer 3 may have a shaped light emitting surface, as illustrated in FIGS. 1–3 or a flat light emitting surface, as desired. Preferably, the light emitting ceramic layer 3 contains voids which provide random volume scattering of the light emitted by the organic light emitting layer of the OLED.

In one preferred aspect of the third embodiment, the light (i.e., visible light, UV or IR radiation) emitting ceramic material 3 comprises a ceramic phosphor doped with light emitting activator ions. The phosphor absorbs light from the organic light emitting layer of the OLED and emits light typically having a longer wavelength. Examples of phosphor materials that can be utilized include those phosphors based on cerium activator doped YAG lattice which crystallizes in the garnet structure ($YAG:Ce^{3+}$). Specific examples of this phosphor include $(Y_{1-x-y}Gd_xCe_y)_3Al_5O_{12}$ (YAG:Gd,Ce), $(Y_{1-x-}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The $YAG:Ce^{3+}$ phosphors can be described generally as $(Y_{1-X-Y}Gd_XCe_Y)_3(Al_{1-Z}Ga_Z)_5O_{12}$, wherein $x+y \leq 1$; $0 \leq x \leq 1$; $0 \leq y \leq 1$; and $0 \leq Z \leq 1$. The position of the peak of the emission band varies considerably in the aforementioned phosphors. Depending on the garnet composition, the $Ce^{3+}$ emission can be tuned from the green (~540 nm; YAG:Ga, Ce) to the red (~600 nm; YAG:Gd:Ce) without appreciable loss in the luminescence efficiency. Furthermore, as described above, the index of refraction of YAG may be matched to that of the adjacent ITO layer of the OLED to reduce Fresnel and critical angle losses.

An appropriate phosphor material or blend of phosphor materials in combination with an OLED, such as a blue or a UV emitting OLED, can produce a white field corresponding to a wide range of color temperatures. Light sources in the form of large area white light electroluminescent panels (i.e., having a size of greater than 1 square meter) which closely approximate the color, CRI, and brightness of conventional fluorescent lamps can be made with such phosphors and organic light emitting devices. For example, $YAG:Ce^{3+}$ partially absorbs a blue light emitted an organic light emitting layer of the OLED, and emits yellow light. The blue light is also partially transmitted through the phosphor layer. The combination of the blue and yellow light appears white to a human observer.

Another yellow emitting phosphor which may be used with the blue emitting OLED to produce white light is manganese doped zinc sulfide ($ZnS:Mn^{2+}$). It should be noted that some of the zinc may be substituted by cadmium.

In another preferred aspect of the third embodiment, the light emitting material 3 comprises a translucent or transparent ceramic matrix material containing light emitting (i.e., photoluminescent) particles. Such particles emit light of a longer wavelength upon absoprtion of shorter wavelength OLED radiation. For example, the light emitting particles may comprise an organic photoluminescent material, such as an organic dye. For example, yellow emitting dye(s), such as Fluorol 7GA or Rhodamine 110, may be used with a blue emitting OLEDs to produce white light. These dyes are available from Lambda Physik, Inc. of Fort Lauderdale, Fla. Alternatively, the light emitting particles may comprise inorganic photoluminescent materials, such as semiconductor nanoparticles having a mean particle size of 100 nm or less, preferably 50 nm or less. For example, the semiconductor particles may comprise II–VI compound semiconductor particles, such as CdS, CdSe or ZnSe, III–V compound semiconductor particles, such as InP or GaP or IV—IV compound semiconductor particles, such as SiC. Alternatively, ceramic phosphor or luminescent glass-phosphor nanoparticles may be added to the ceramic matrix material. In addition, more than one phosphor, dye or light emitting particle type may be combined together and then utilized with an organic light emitting device to achieve different colors (i.e., white or other colors), color temperatures, and color rendition indices.

The Components of the OLED Device

Figure 4:
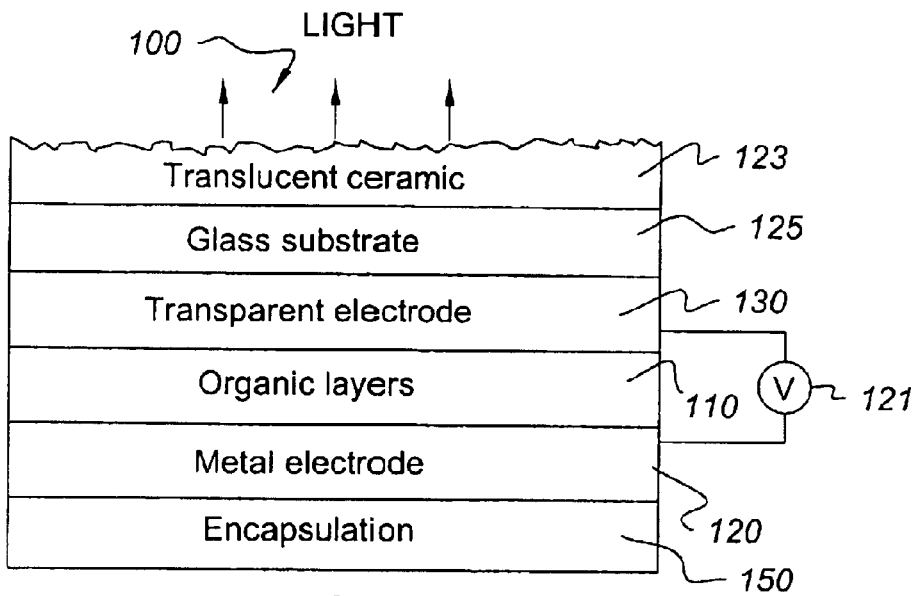
FIG. 4 is a drawing of an organic light emitting device according to one preferred embodiment of the invention.

The organic electroluminescent device 1 may comprise any type of organic light emitting device, such as an OLED. The term "light" includes visible light as well as UV and IR radiation. The device 100 according to one preferred aspect of the present invention is illustrated in FIG. 4. The organic light emitting device 100 includes an organic light emitting layer 110 disposed between two electrodes, e.g., a cathode 120 and an anode 130. The organic light emitting layer 110 emits light upon application of a voltage across the anode and cathode from the voltage source 121. The organic light emitting device 100 may optionally include a device substrate 125, made of a material such as glass or transparent plastic, such as PET (MYLAR®) or polycarbonate, as shown in FIG. 4. The term "organic light emitting device" generally refers to the combination which includes the, organic light emitting layer, the cathode, and the anode, and which may also include other elements, such as the device substrate and device electrical contacts, as will be described below. If desired, an encapsulation layer or sealing member 150, such as epoxy or glass, may be formed adjacent to the cathode 120 (back) side of the OLED 100.

The ceramic output coupler 123 is formed on the light emitting surface of the device 100, for example, over the transparent anode layer 130 and/or over the substrate 125, if present. The ceramic output coupler 123 is projected to eliminate up to 60 to 80% of the internal reflection losses. The device size may range from 2.5 to 10 $cm^2$ up to 0.3 m×0.3 m (i.e., 1 $ft^2$). Furthermore, the individual devices may be assembled or tiled onto a common substrate having an area of up to 3.6 $m^2$ (0.6 m×0.6 m), when individual device areas range from 15 cm×15 cm to 0.3 m×0.3 m.

The Electrodes

The anode and cathode inject charge carriers, i.e., holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, a metal such as calcium, gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the organic light emitting device 100. The anode 130 may comprise, for example, indium tin oxide (ITO), tin oxide, nickel, or gold. The electrodes 120, 130 can be formed by conventional vapor deposition techniques, such as evaporation or sputtering, for example.

The Organic Emitting Layer(s)

A variety of organic light emitting layers 110 can be used in conjunction with exemplary embodiments of the invention. According to one embodiment shown in FIG. 4, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 5–8, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 4, will now be described. According to one embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference. Another preferred blue light emitting polyfluorine is poly(9,9-di-n-hexylfluorine-2,7-diyl) which has a broad double emission peak between about 415 and 460 nm.

According to a another embodiment of a single layer device as shown in FIG. 4, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum (III) (Alq). TPD has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TPD to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 5:
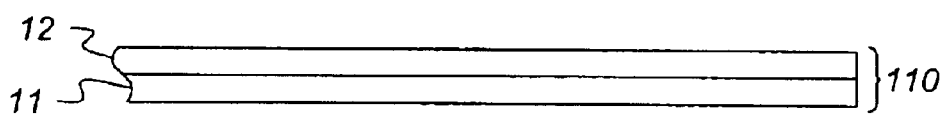
FIGS. 5–8 illustrate various examples of organic light emitting layers formed of two or more sublayers.

According to another embodiment of the invention shown in FIG. 5, the organic light emitting layer 110 comprises two sublayers. The first sublayer 11 provides hole transport, electron transport, and luminescent properties and is positioned adjacent the cathode 120. The second sublayer 12 serves as a hole injection sublayer and is positioned adjacent the anode 130. The first sublayer 11 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 12 serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 6:
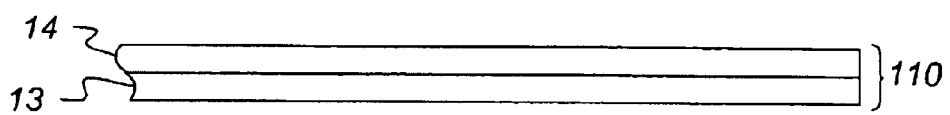

According to another embodiment of the invention shown in FIG. 6, the organic light emitting layer 110 includes a first sublayer 13 comprising a luminescent sublayer and a second sublayer 14 comprising a hole transporting sublayer. The hole transporting sublayer 14 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 7:
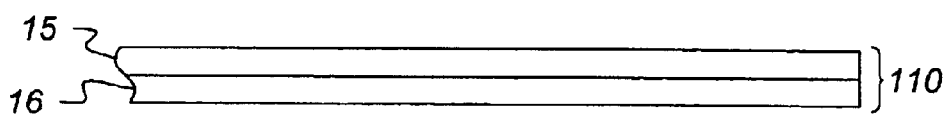

According to another embodiment of the invention shown in FIG. 7, the organic light emitting layer 110 comprises a first sublayer 15 which includes luminescent and hole transport properties, and a second sublayer 16 which includes electron injection properties. The first sublayer 15 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to $\pi$-conjugated polymers, polysilanes are quasi one-dimensional materials with delocalized $\sigma$-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methyl-phenylsilane) (PMPS), and poly[-bis(p-butylphenyl)silane] (PBPS). The polysilane sublayer 15 can be applied by spin coating from a toluene solution, for example. The electron injection sublayer 16 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 8:
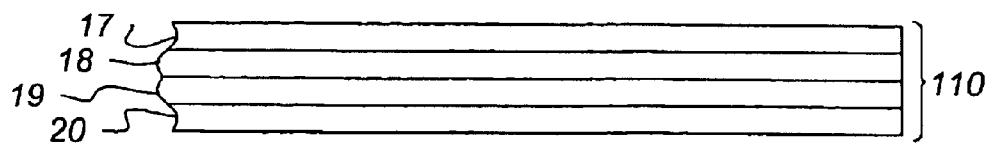

According to another embodiment of the invention shown in FIG. 8, the organic light emitting layer 110 comprises a hole injecting sublayer 17, a hole transporting sublayer 18, a luminescent sublayer 19, and an electron injecting sublayer 20. The hole injecting sublayer 17 and hole transporting sublayer 18 efficiently provide holes to the recombination area. The electrode injecting sublayer 20 efficiently provides electrons to the recombination area.

The hole injecting sublayer 17 may comprise a porphyrinic compound, such as a metal free phthalocyanine or a metal containing phthalocyanine, for example. The hole transporting sublayer 18 may comprise a hole transporting aromatic tertiary amine, where the latter is a compound containing at least one trivalent nitrogen atom that is bonded only to carbon atoms, at least one of which is a member of an aromatic ring. The luminescent sublayer 19 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 20 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design an organic light emitting device which emits in one or more desired colors. For example, the organic light emitting device 100 can emit ultraviolet, blue, green, or red light.

Sealing Member, Contacts and Output Coupler

Figure 9:
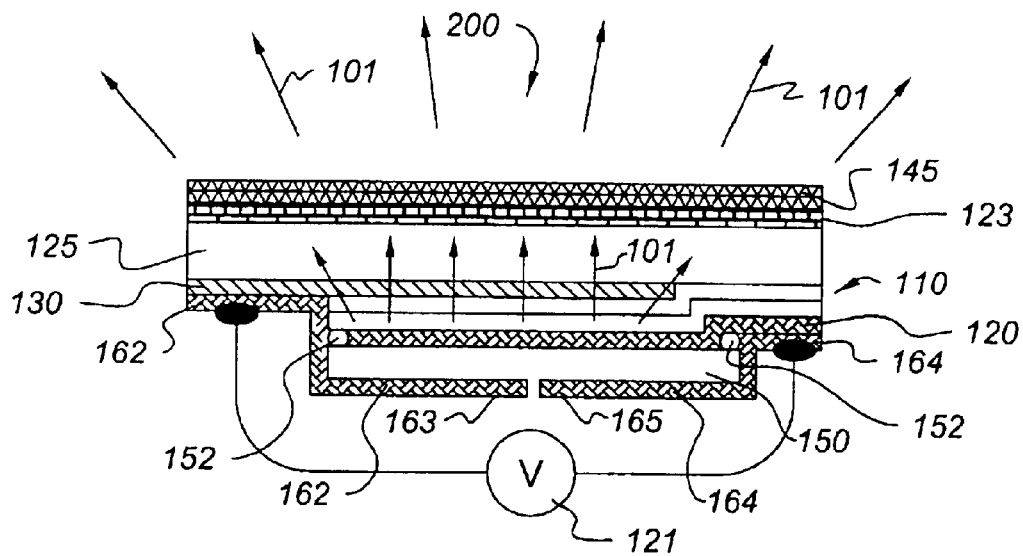
FIG. 9 is a side view of an organic light emitting device according to another preferred embodiment of the invention.
Figure 10:
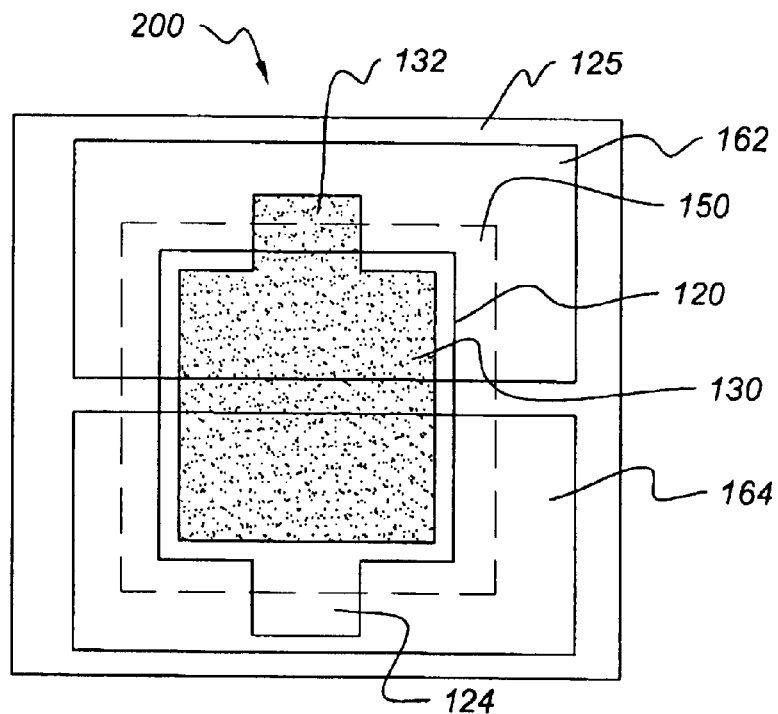
FIG. 10 is a bottom view of the organic light emitting device of FIG. 9.

Referring to FIGS. 9 and 10, an organic light emitting device is shown according to another embodiment of the invention. The organic light emitting device 200 comprises an organic light emitting layer 10, a cathode 120, and an anode 130 which is light transmissive. The organic light emitting device 200 also includes a device substrate 125 which is light transmissive. The elements in FIGS. 9 and. 10 (e.g. the anode 130, cathode 120, light emitting layer 110) corresponding to those in FIG. 4 can be formed of the same materials as described above with respect to FIG. 4. Upon application of a voltage, light (represented by arrows 101) is generated in the light emitting layer 110 and propagates through the anode 130 and the device substrate 125.

Adjacent to the cathode 120 is a sealing member 150, typically comprising glass, which provides a barrier to oxygen and water. The sealing member 150, in conjunction with a sealant 152 which may comprise epoxy, a metal, or a glass frit, for example, provides a near hermetic barrier to prevent water and oxygen penetration into the cathode 120, anode 130 and organic light emitting layer 110.

Formed adjacent to the sealing member 150 are first and second device electrical contacts 162, 164, which provide electrical connections to the anode 130 and cathode 120, respectively. As shown most clearly in FIG. 10, the first device electrical contact 162 connects electrically to the anode 130 in a tab region 132 of the anode 130. The tab region 132 is beyond the perimeter of the sealing member 150. The second device electrical contact 164 connects electrically to the cathode 120 in a tab region 124 of the cathode 120. The tab region 124 is beyond the perimeter of the sealing member 150. The organic light emitting layer 110 (not shown in FIG. 10) typically occupies at least the overlap region of the anode 130 and cathode 120 and may extend beyond these electrodes.

Referring again to FIG. 9, the device electrical contacts 162, 164 typically have respective device contacting surfaces 163, 165 which occupy a common plane. These device contacting surfaces 163, 165 facilitate the mounting of one or more organic light emitting devices 200 onto a mounting substrate, as will be described further below in connection with FIG. 12.

An advantageous feature of the device electrical contacts 162, 164 can be described with reference to an imaginary surface running through the light emitting layer 110. The imaginary surface, which is typically planar, divides the organic light emitting device 200 into a first side and a second side. The anode 130 is on the first side, and the cathode 120 is on the second side. The light is emitted through the first side, and the device electrical contacts 162, 164 extend to the second side. For example, the first device electrical contact 162 extends from the anode 130 on the first side to the second side of the organic light emitting device. The second device electrical contact 164 extends from the cathode 120 on the second side to another location on the second side of the organic light emitting device. Thus, the organic light emitting device 200 can be powered by contacting both device electrical contacts 162, 164 on a common planar surface 163, 165 which is on an opposite side of the organic light emitting device as where the light emission occurs. Typically the planar surface defined by surfaces 163, 165 is parallel to the light emitting layer 110 and the device substrate 125. This configuration allows a number of organic light emitting devices 200 to be easily mounted adjacent to each other ("tiled") on a mounting substrate.

As shown in FIG. 10, the device substrate 125 can define the area of the organic light emitting device 200. The first and second device electrical contacts 162, 164 can occupy an area which is within the area of the device substrate 125. Therefore, two organic light emitting devices 200 can be placed directly adjacent to each other without any electrical connectors in between and with a small separation distance between the adjacent light emitting device substrates 125. For example, if desired, the separation distance could be less than 2 centimeters (cm), 1 cm, 0.5 cm or 0.25 cm, but is typically greater than 0.1 cm.

A ceramic output coupler 123 is formed adjacent to the substrate 125 (or adjacent to the anode 130 if the substrate 125 is omitted), as illustrated in FIG. 9. As described above, the ceramic output coupler may comprise a light emitting material, such as a phosphor, which emits white light. An alternative way of generating white light from the organic light emitting device with a transparent or translucent ceramic output coupler without using a phosphor or a dye is to utilize a full color display with separately addressable color pixels and tune the colors to emit white light. This approach allows color tunability but increases complexity and cost. Furthermore, instead of using separately addressable color pixels, a blend of various dye molecules and/or polymers that emit different colors can be placed into the active region of the device 200 to achieve white light. This approach has the advantage of simple, low cost, fabrication. However, different organic components in the device can age differently, which leads to a color shift with time. In contrast, the use of the phosphor output coupler 123 is advantageous because the device does not suffer from color shifts due to differential aging of different organic molecular and polymer components.

The organic light emitting device 200 may also include an optional scattering layer 145 comprising scattering particles, such as $TiO_2$ or $SiO_2$, for effective color mixing and brightness uniformity. However, this layer 145 is preferably omitted in view of the volume scattering properties of the ceramic output coupler 123.

Figure 11:
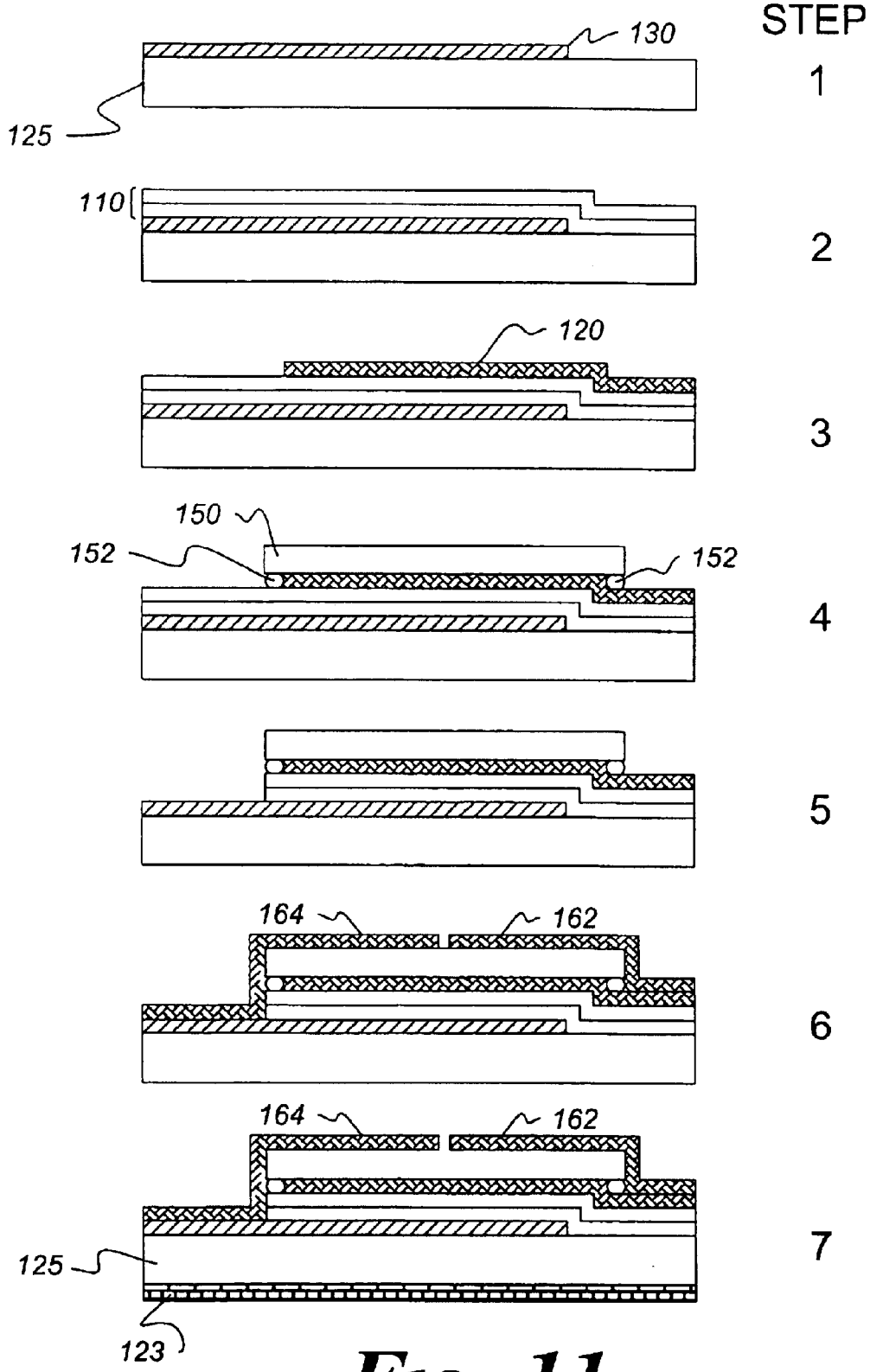
FIG. 11 illustrates a method of making the organic light emitting device of FIG. 9 according to a preferred embodiment of the present invention.

Method of Making of Making the OLED Device—Method of Making the Active Device Layers FIG. 11 illustrates a method for forming the organic light emitting device 200 of FIGS. 9 and 10 according to an exemplary embodiment of the invention. As shown in FIG. 11, step 1, a glass substrate 125 is sputter coated with a layer of thin indium tin oxide (ITO). The ITO is then patterned to form the anode 130, e.g. in the pattern shown in FIG. 10. In step 2, the organic light emitting layer 110 (which may include one or more sublayers as shown in FIGS. 4–8) is deposited, for example by spin coating or inkjet processing. In step 3, the cathode 120 is deposited as a reflective structure comprising a thin layer of lithium fluoride overcoated with aluminum, for example. The cathode 120 can be deposited through a stencil mask by evaporation, for example. The sealing member 150, which may comprise glass, for example, is next applied with a sealant 152 in step 4 to form a near hermetic barrier.

In step 5, the organic light emitting layer 110 extending beyond the sealing member 150 is removed by solvent or dry etching methods. The device electrical contacts 162, 164, which may comprise a metal such as aluminum or silver, are then applied to the reflective side of the organic light emitting device 200 in step 6. The device electrical contacts 162, 164 allow for external contact to the organic light emitting device and additionally can provide a near hermetic seal to the anode 130, cathode 120, and light emitting layer 110. In step 7, the output coupler 123, is applied to the device substrate 125. Optionally, a layer of scattering particles 145 can be applied in a subsequent step. The steps shown in FIG. 11 are of course merely an example of a method of making a light source, and not intended to be limiting. For example, the ceramic output coupler 123 may be used as the substrate, and the substrate 125 may be eliminated, as illustrated in FIG. 2. In this case, the anode 130, at least one organic light emitting layer 110 and the cathode 120 are formed on the ceramic substrate 123.

Method of Making the Ceramic Output Coupler

The ceramic output coupler 3, 123 may be formed by any known ceramic manufacturing method. For example, the ceramic output coupler is preferably made by the powder method, in which metal oxide starting powders are mixed in a desired ratio and then heated or sintered to form the output coupler.

Several methods may be used to form the dimples or corrugations 4. One exemplary method of forming a shaped surface involves sand blasting or scouring the light emitting surface of the ceramic output coupler with a rough polishing pad. Another exemplary method involves casting, pressure molding or injection molding a ceramic output coupler in a shaped mold cavity. Such a method involves first placing a ceramic precursor material, such as the starting metal oxide powders into a mold cavity. The precursor material may be cast into a mold, pressed in a press mold or injected into a mold from an injection molding apparatus. The precursor material is solidified to form a shaped ceramic output coupler having a corrugated or dimpled light emitting surface. The precursor material may solidified by pressing the metal oxide powder in a press mold, by heating and cooling the cast metal oxide powder in a casting mold or by cooling a viscous metal oxide mixture that was injected into an injection mold cavity. The shaped molded body is then preferably sintered to form a ceramic output coupler.

The mold cavity surface may be selected to have a random selection of grooves and ridges to form a randomly textured ceramic output coupler surface. Alternatively, the mold cavity surface may be designed with a regular sinusoidal, pseudo-pyramidal or conical arrangement of grooves and ridges to form an ordered pattern of dimples or corrugations 4. The sintering conditions, precursor powder composition and precursor powder size may be selected or optimized to form a ceramic output coupler whose the index of refraction differs by 0.1 or less from the index of refraction of the adjacent layer of the electroluminescent device and which contains voids which randomly scatter light emitted by the organic light emitting layer. The ceramic output coupler may be selected form any desired ceramic materials, such as $Al_2O_3$, $Y_2O_3$, $Y_3Al_5O_{12}$, $MgAl_2O_4$, MgAlON, AlN, AlON, or $TiO_2$ doped $ZrO_2$. The following are two non limiting examples of preparing an alumina output coupler using press molding and injection molding. It should be understood that other similar materials and methods may be used instead.

A mixture of a ceramic powder and a binder is placed into a press mold containing a shaped mold cavity. Typically, the mixture comprises 95–98% by weight ceramic powder and 2–5% by weight organic binder. The ceramic powder may comprise alumina ($Al_2O_3$) having a purity of at least 99.98% and a surface area of about 2–10 $m^2/g$. The alumina powder may be doped with magnesia to inhibit grain growth, for example in an amount equal to 0.03%–0.2%, preferably 0.05%, by weight of the alumina. Binders which may be used individually or in combination include organic polymers such as polyols, polyvinyl alcohol, vinyl acetates, acrylates, cellulosics and polyesters.

Subsequent to die pressing, the binder is removed from the green part, typically by thermal pyrolysis, to form a bisque-fired part. The thermal pyrolysis may be conducted, for example, by heating the green part in air from room temperature to a maximum temperature of about 900–1100° C. over 4–8 hours, then holding the maximum temperature for 1–5 hours, and then cooling the part. After thermal pyrolysis, the porosity of the bisque fired part is typically about 40–50%.

The bisque fired part is then sintered. The sintering step may be carried out by heating the bisque fired parts in hydrogen having a dew point of about 10–15° C. Typically the temperature is increased from room temperature to about 1300° C. over a two hour period. Next, the temperature is held at about 1300° C. for about 2 hours. Next, the temperature is increased by about 1000° C. per hour up to a maximum temperature of about 1850–1880° C. Next, the temperature is held at 1850–1880° C. for about 3–5 hours. Finally, the temperature is decreased to room temperature over about 2 hours. The inclusion of magnesia in the ceramic powder typically inhibits the grain size from growing larger than 75 microns. The resulting ceramic material comprises a densely sintered polycrystalline alumina. Sintering of the bisque fired parts typically reduces the porosity to less than 0.1%, and increases the total transmittance to at least 95%. Porosity is conventionally defined as a unitless number representing the proportion of the total volume of an article which is occupied by voids. At a porosity of 0.1% or less, the alumina typically has a suitable optical transmittance or translucency.

According to another exemplary method, the output coupler is made by injection molding. A mixture comprising about 45–60% by volume ceramic material and about 55–40% by volume binder is prepared. The ceramic material can comprise an alumina powder having a surface area of about 1.5 to about 10 $m^2/g$, typically between 3–5 $m^2/g$. According to one embodiment, the alumina powder has a purity of at least 99.98%. The alumina powder may be doped with magnesia to inhibit grain growth, for example in an amount equal to 0.03%–0.2%, preferably 0.05%, by weight of the alumina.

The binder may comprise a wax mixture or a polymer mixture. According to one preferred example, the binder comprises:

33⅓ parts by weight paraffin wax, melting point 52–58° C.;

33⅓ parts by weight paraffin wax, melting point 59–63° C.;

33⅓ parts by weight paraffin wax, melting point 73–80° C.;

The following substances are added to the 100 parts by weight paraffin wax:

4 parts by weight white beeswax;

8 parts by weight oleic acid;

3 parts by weight aluminum stearate.

The above paraffin waxes are available from Aldrich Chemical under product numbers 317659, 327212, and 411671, respectively.

In the process of injection molding, the mixture of ceramic material and binder is heated to form a high viscosity mixture. The mixture is then injected into a suitably shaped mold and subsequently cooled to form a molded ceramic output coupler having dimples or corrugations 4. Subsequent to injection molding, the binder is removed from the molded part, typically by thermal treatment, to form a debindered part. The thermal treatment may be conducted by heating the molded part in air or a controlled environment, e.g. vacuum, nitrogen, rare gas, to a maximum temperature, and then holding the maximum temperature. For example, the temperature may be slowly increased by about 2–3° C. per hour from room temperature to a temperature of 160° C. Next, the temperature is increased by about 100° C. per hour to a maximum temperature of 900–1100° C. Finally, the temperature is held at 900–1100° C. for about 1–5 hours. The bisque fired body is subsequently cooled. After the thermal treatment step, the body porosity is about 40–50%. The bisque-fired body is then sintered under the conditions described above to reduce the porosity to less than 0.1%, and increase the total transmittance of the ceramic output coupler to at least 95%. It should be noted that while a polycrystalline alumina substrate has been described, a single crystalline alumina (i.e., sapphire) substrate may also be used.

The ceramic output coupler 123 comprises a first ceramic material, such as alumina, which may contain surface recesses at grain boundaries. Such surface recesses are undesirable on the back surface (i.e., the surface adjacent to the anode 130 or substrate 125). Therefore, in a preferred aspect of the present invention, a second ceramic material is provided in the recesses between the first ceramic material and an adjacent layer of the OLED device 100. The second ceramic material may comprise the same material as the first ceramic material, for example alumina, or a different ceramic material than the first ceramic material. The second ceramic material is preferably formed in surface recesses at grain boundaries of the ceramic output coupler by a sol-gel method. The second ceramic material provides a smooth interface between the output coupler 123 and an adjacent layer (i.e., 125 or 130) of the OLED 100, 200.

Method of Making an OLED Array

Figure 12:
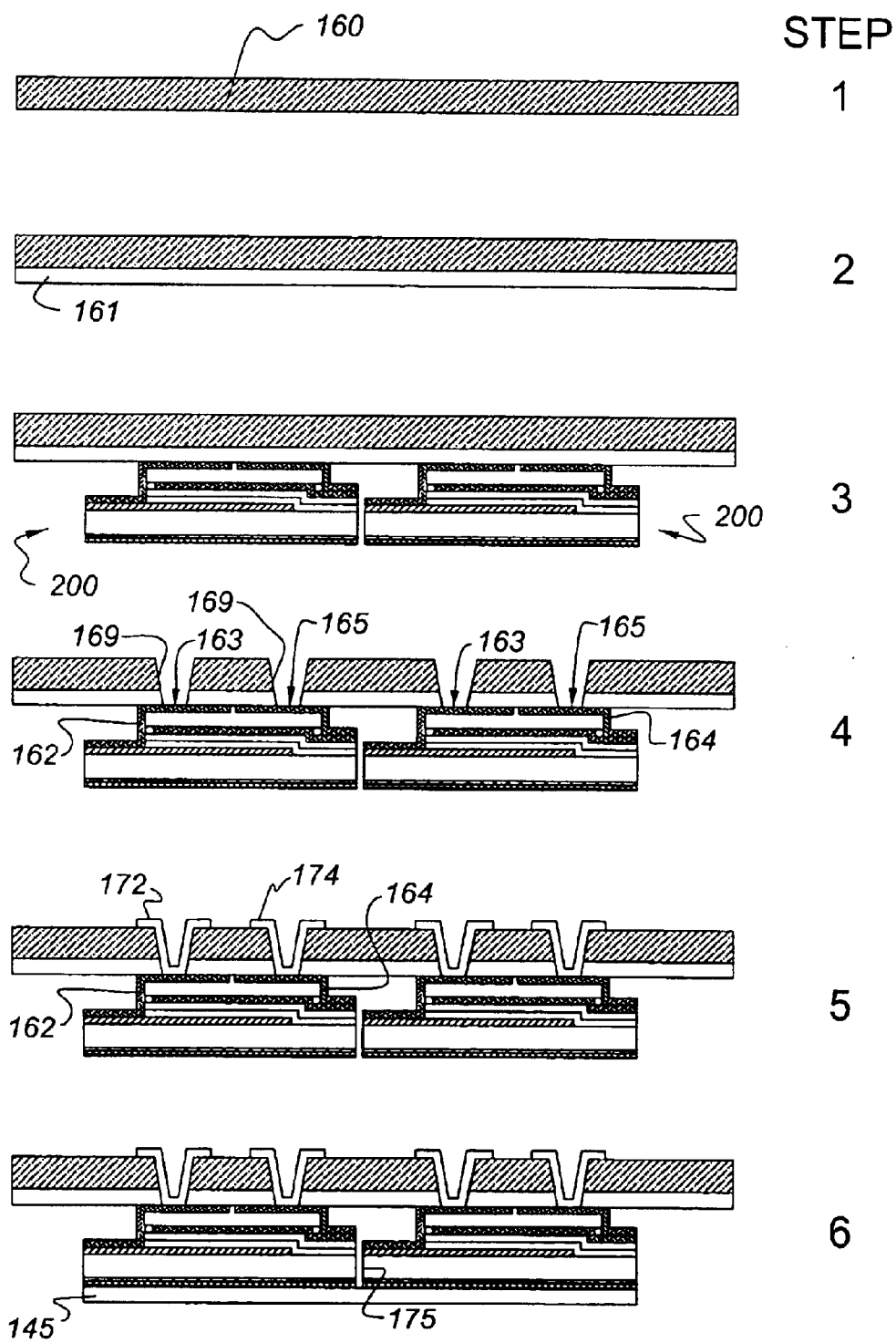
FIG. 12 illustrates a method of mounting a plurality of light emitting devices on a mounting substrate to produce a light source according to a preferred embodiment of the invention.

FIG. 12 illustrates a method of mounting one or more organic light emitting devices onto a mounting substrate to form a light source according to an exemplary embodiment of the invention. The term "light source" generally refers to the combination of at least one, and usually many, organic light emitting devices 200 mounted on a mounting substrate. Step 1 shows the mounting substrate 160, which may comprise a conventional printed circuit board such as FR4 or GETEK, or a flexible polymer film such as Kapton E™ or Kapton H™ polyimide (Kapton is a trademark of E. I. Du Pont de Nemours & Co.), Apical AV polyimide (Apical is a trademark of Kanegafugi Chemical Company), or Upilex polyimide (Upilex is a trademark of UBE Industries, Ltd) for example. In one embodiment, free-standing Kapton™ polyimide is mounted on a rigid frame (not shown in FIG. 12) which rigidly supports the flexible film during processing and for end use if desired. An adhesive, typically comprising a material capable of adhering at a low temperature, can be applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161, which is typically organic, such as ULTEM™, SPIE (siloxane polyimide epoxy) or other polyimide and epoxy blends, or cyanoacrylate is applied to the mounting substrate 160, as shown in FIG. 12. In step 3, one or more organic light emitting devices 200 are placed on the adhesive 161, and the adhesive is cured to bond the organic light emitting devices 200 to the mounting substrate 160.

In step 4, vias 169 are formed using laser ablation or reactive ion etching, for example, through the mounting substrate 160 and the adhesive 161 to the device contacting surfaces 163, 165 of the device electrical contacts 162, 164, respectively. In step 5, first and second mounting electrical contacts 172, 174 are formed or inserted into the via holes 169 to make contact with the device electrical contacts 162, 164, respectively. The mounting electrical contacts 172, 174 can be formed as a patterned metal layer using sputter or electroless plating techniques, in combination with electroplating if desired, and patterned with a standard photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The mounting electrical contacts 172, 174 can also be applied by the conventional methods of evaporation with a shadow mask or screen printing.

In step 6, if the output coupler 123 has not yet been applied to the devices (i.e., if the output coupler 123 has not been applied in the process illustrated in FIG. 11), then the output coupler 123 and optionally the scattering layer 145 can be applied at this time to organic light emitting devices 200 individually, or more typically can be applied across a number of organic light emitting devices 200, as shown in FIG. 12. Although not shown in step 6, a nonconductive material such as SPIE (siloxane polyimide epoxy) can be inserted into the gaps 175 between adjacent organic light emitting devices 200. Although only two organic light emitting devices 200 are shown in FIG. 12, this method can of course be used to make large area light sources comprising many individual organic light emitting devices 200.

Although embodiments of the present invention allow the organic light emitting devices 200 to be placed very close to each other on the mounting substrate 160, it may be desirable in some applications to have a larger spacing between individual organic light emitting devices 200. In such cases, it may not be desirable to have a scattering layer 145 which bridges adjacent organic light emitting devices 200.

Spacing between organic light emitting devices 200 may also occur in the case where the mounting substrate 160 is designed to be flexible, curved, or non-planar. The mounting substrate 160 may be formed in any desired shape, e.g. to conform to an existing building structure. The organic light emitting devices 200 can be sized such that they collectively follow the shape of the mounting substrate. Thus, the combination of a flexible, curved, or non-planar mounting substrate and appropriately sized organic light emitting devices 200 can produce a light source having an emitting surface in many desired shapes, e.g. cylindrical, spherical, etc. The spacing of the organic light emitting devices 200 on the mounting substrate 160 can also be designed such that the mounting substrate 160 can form a right angle between adjacent organic light emitting devices 200. In this case, the emitting surfaces of adjacent organic light emitting devices would together form a corner with perpendicular emitting surfaces.

Figure 13:
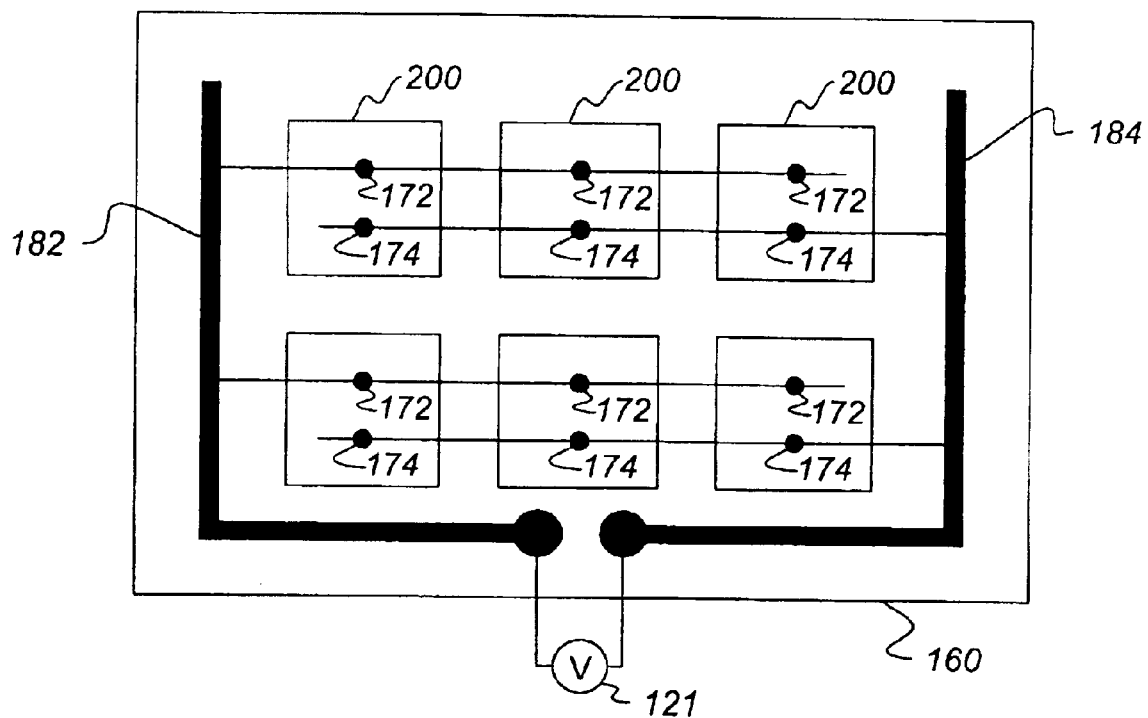
FIG. 13 is a diagram of electrical connections to a plurality of organic light emitting devices according to a preferred embodiment of the invention.

After the mounting electrical contacts have been installed, they can be connected to a suitable power supply. FIG. 13 illustrates an example of a connection layout for six organic light emitting devices 200. The first mounting electrical contacts 172 are all connected to a first line 182 and the second mounting electrical contacts 174 are all connected to a second line 184. Upon application of a voltage, the plurality of organic light emitting devices 200 are activated. One advantage of exemplary embodiments of the invention is that the connecting structure, e.g. as shown in FIG. 13, can utilize highly conductive materials such as copper to efficiently carry power to the individual organic light emitting devices 200.

Preferably, the fill factor of the devices 200 in FIGS. 12 and 13 is above 0.3, most preferably between 0.5 and 0.8. The fill factor is defined as a ratio of the area of the devices 200 to the total area of the mounting substrate 160. The high fill factor is advantageous for a device used for lighting applications.

Emission Optimization

In one preferred embodiment of the present invention, the cathode reflectivity, the output coupler's shape, composition and optical thickness are optimized to increase the extraction efficiency of the OLED 100, 200. The cathode 120 material of the devices 100, 200 illustrated in FIGS. 4 and 9, respectively, is selected to have a reflectivity of 80% and above, preferably 86% and above. Examples of such cathode 120 materials include calcium, which has a reflectivity of 80% in the visible region of 400–700 nm, aluminum, which has a reflectivity of greater than 86% throughout the visible region, and silver, which has a reflectivity of greater than 90% in the visible region. Gold also a reflectivity above 95% at wavelengths longer than 680 nm.

The ceramic output coupler 3, 123 shape contains the outer surface with dimples or corrugations 4, as illustrated in FIGS. 1 and 2. The output coupler 3, 123 optical thickness for scattering is selected to range from about 0.1 to about 0.9, preferably about 0.5. Optical thickness for scattering is defined in P. S. Mudgett et al., 10 Appl. Optics (July 1971) 1485, incorporated herein by reference, and is a function of the product of the output coupler thickness, the concentration of the light scatterers (i.e., voids) and the light scattering efficiency of the voids. Therefore, the thickness of the output coupler as well as the concentration of the light scattering voids may be varied in this embodiment as desired, as long as the optical thickness for scattering of the output coupler is selected to range from about 0.1 to about 0.9, preferably about 0.5.

A corresponding value of the degree of light scattering can be gleaned from experimental data rather than from theoretical calculations of the optical thickness for scattering, such as that of Mudgett et al. Experimentally, a degree of light scattering can be quantified by determining what fraction of a nearly collimated beam of light incident on the plate at normal incidence is transmitted through the plate and remains collimated after transmission, as opposed to being reflected or scattered into other, non-normal angles following transmission (the so called "in-line transmission"). The lower the value of transmission the higher the amount scattering. In the absence of light scattering, the "in-line transmission" value determined by the Fresnel coefficients, for a typical glass is about 0.92. Thus, for isotropically scattering voids embedded in a medium having an index of refraction of 1.5 and having an optical thickness for scattering value of 0.1, the "in-line transmission" is 0.835. For isotropically scattering voids embedded in a medium having an index of refraction of 1.5 and having an optical thickness for scattering value of 0.9, the "in-line transmission" is 0.38.

Figure 14:
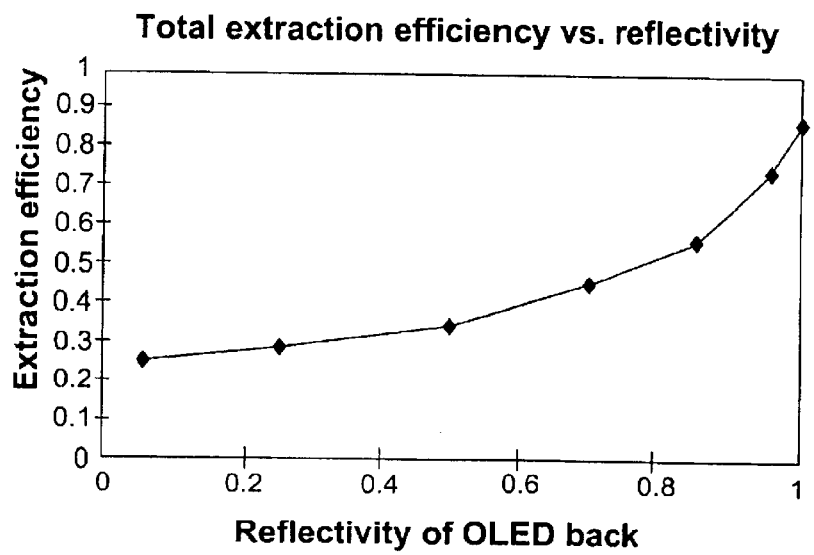
FIG. 14 is a graph of the calculated extraction efficiency versus cathode reflectivity for an organic light emitting device according to a preferred embodiment of the invention.

FIG. 14 is a graph of a calculated total extraction efficiency versus reflectivity of the of the back of the OLED. It was assumed that the transparent ITO electrode of the LED was grown directly on an alumina substrate/output coupler 3, and that the glass substrate 5 was omitted. Extraction efficiency is defined as a ratio of the number of light photons emitted into the air divided by the number of light photons produced in the organic light emitting layer 110. The extraction efficiency was calculated (using scheme of Mudgett et. al.) based upon the Mie model of light scattering for voids embedded in alumina having a 1.77 index of refraction. The Mie model assumes spherical voids which are approximately one optical wavelength in size. In the graph of FIG. 14, the reflectivity of the back of the OLED device 100, 200 was selected to be the reflectivity of the cathode 120. The efficiency of injection from the active layer into the ceramic output coupler was assumed to be 0.87, the ratio of medium absorption to scattering (k/s) was assumed to be 0.005 and the optical thickness for scattering value, "s", of the output coupler was assumed to be 0.5.

As can be seen from FIG. 14, the light extraction efficiency ranges from about 0.53 for cathode reflectivity of 80% to about 0.73 for cathode reflectivity of 98%. Therefore, an extraction efficiency of about 53% may be obtained by using a calcium cathode, of about 58% by using an aluminum electrode and of about 73% by using a silver electrode. This is an improvement of about 20 to 40% in the value of extraction efficiency compared to an OLED that lacks an output coupler. In contrast, a prior art flat OLED on a glass substrate has a calculated extraction efficiency of about 33% using the same calculation method. Thus, at least a 20% improvement in extraction efficiency may be obtained by using a ceramic output coupler.

Figure 15:
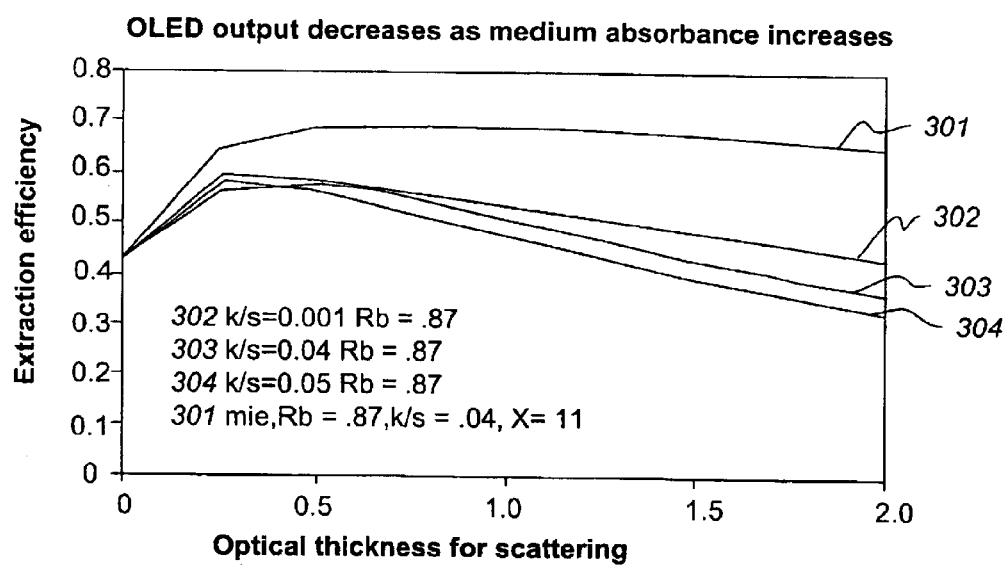
FIG. 15 is a graph of the calculated extraction efficiency versus optical thickness for an organic light emitting device according to a preferred embodiment of the invention.

FIG. 15 is a graph of a calculated total extraction efficiency versus optical thickness. The extraction efficiency was calculated (using scheme of Mudgett et. al.) based upon the Mie (line 301 in FIG. 15) and isotropic (lines 302, 303 and 304) models of light scattering for particles embedded in an alumina media having a 1.77 index of refraction. The isotropic model assumes each void scatters light uniformly in all directions. In the graph of FIG. 15, the reflectivity, ($R_b$), of the back of the OLED device 100, 200 was selected to be the reflectivity of the cathode 120, which has a selected reflectivity value of 87%. The k/s ratio was assumed to be 0.04 for lines 301 and 303, 0.001 for line 302, and 0.05 for line 304. The other conditions were the same as in FIG. 14. As can be seen from FIG. 15, the extraction efficiency ranges from about 0.48–0.52, for an optical thickness value of 0.1, to about 0.5–0.69 for an optical thickness value of 0.9. The extraction efficiency is 0.5 and above for an optical thickness value of about 0.2 to about 0.8.

Figure 16:
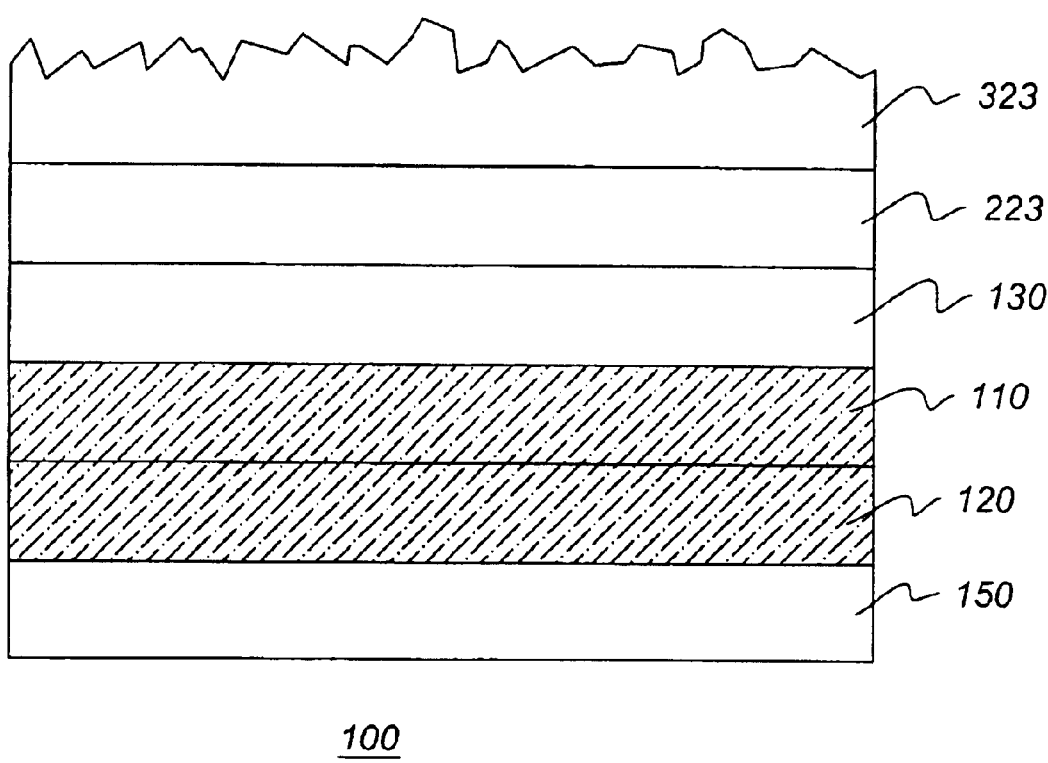
FIG. 16 is a drawing of an organic light emitting device according to one preferred embodiment of the invention.

In another preferred embodiment of the present invention, the extraction efficiency may be further improved by using a plurality of output coupler layers instead of a single output coupler layer 3 in FIGS. 1–3. For example, as illustrated in FIG. 16, by using a higher index of refraction output coupler layer 223 and a lower index of refraction output coupler layer 323, the extraction efficiency may be increased by 2–3%. The first output coupler layer 223 is formed adjacent to the transparent ITO anode layer 130. The second output coupler layer 323 having a lower index of refraction than layer 223 is formed adjacent layer 223. For example, layer 223 may comprise YAG having n=1.83 and layer 323 may comprise $MgAl_2O_4$ having n=1.71. Using this layout, the first output coupler layer 223 has an index of refraction that is close to the index of refraction value of about 1.8 of the ITO anode layer 130. Thus, the index of refraction of layer 223 is matched to that of the underlying active device layer 130 (i.e., to a surface of the OLED device). Furthermore, the index of refraction of layer 323 is matched to that of layer 223. Therefore, the critical angle and Fresnel losses at the interfaces of layers 130/223 and 223/323 are reduced. Furthermore, since the difference between the index of refraction of air (n=1) and layer 323 is less than the difference between the index of refraction of air and layer 223, the losses at the air/output coupler interface are reduced by adding layer 323. Thus, the extraction efficiency of an OLED having a YAG/$MgAl_2O_4$ output coupler is expected to increase by 2% over a device having a single layer YAG output coupler.

It should be noted that layer 323 preferably has a corrugated outer surface, as illustrated in FIG. 16. Furthermore, layers 223 and/or 323 may comprise other ceramic materials, as desired. Still further, third through nth output coupler layers may be added over layer 323, with each succeeding layer having a smaller index of refraction in order to further reduce the large difference in the index of refraction between air and the outer output coupler layer.

Alternatively, an output coupler 3 with a graded or gradually decreasing index of refraction from its inner to its outer surface may be used instead. Such an output coupler may be obtained by graded or gradient doping the output coupler layer with the nanoparticles, such as $TiO_2$. For example, the inner portion of layer 3 (i.e., the portion adjacent to the active device layers) may have the highest nanoparticle doping concentration and the outer portion (i.e., the portion adjacent to the air interface) may have the lowest nanoparticle doping concentration. Thus, an inner portion of the layer has a first index of refraction that is matched to an index of refraction of an adjacent layer of the electroluminescent device and an outer portion of the layer has a second index of refraction that is lower than the first index of refraction. The gradient or graded index of refraction profile reduces losses at the interface between discrete layers 223 and 323.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. An organic electroluminescent light emitting device, comprising:

a first electrode;

a second electrode;

at least one organic light emitting layer; and a ceramic output coupler;

wherein the device comprises an organic light emitting diode, the ceramic coupler comprises a ceramic layer containing a light emitting surface of the device and comprises a shaped translucent ceramic material attached to the organic light emitting diode, the light emitting surface has dimples or corrugations, which have a sinusoidal, pseudo-pyramidal or conical shape, and each dimple or corrugation has a height greater than 0.1 micron and a spacing between dimple or corrugation peaks is a factor of 10 or less of the dimple or corrugation height.

2. An organic electroluminescent light emitting device, comprising:

a first electrode;

a second electrode;

at least one organic light emitting layer; and a ceramic output coupler;

wherein the device comprises an organic light emitting diode; the ceramic coupler comprises a ceramic layer containing a light emitting surface of the device; and the ceramic output coupler comprises a first ceramic layer having a first index of refraction that is matched to an index of refraction of an adjacent layer of the electroluminescent device, and a second ceramic layer having a second index of refraction lower than the first index of refraction.

3. The device of claim 2, wherein the first ceramic layer comprises $Y_3Al_5O_{12}$, and the second ceramic layer comprises $MgAl_2O_4$.

4. An organic electroluminescent light emitting device, comprising:

a first electrode;

a second electrode;

at least one organic light emitting layer; and a ceramic output coupler;

wherein the device comprises an organic light emitting diode, the ceramic coupler comprises a ceramic layer containing a light emitting surface of the device, and the ceramic output coupler comprises a ceramic layer having a graded index of refraction, wherein an inner portion of the layer has a first index of refraction that is matched to an index of refraction of an adjacent layer of the electroluminescent device and an outer portion of the layer has a second index of refraction that is lower than the first index of refraction.

5. An organic electroluminescent light emitting device, comprising:

a first electrode;

a second electrode;

at least one organic light emitting layer;

a voltage source electrically coupled to the first and second electrodes; and a ceramic output coupler;

wherein the device comprises an organic light emitting diode, the ceramic coupler comprises a ceramic layer containing a light emitting surface of the device, the electroluminescent device emits white light, the first electrode comprises a metal containing electrode, the organic light emitting layer comprises at least one an organic molecule layer or at least one polymer layer over a first side of the first electrode, and the second electrode comprises a transparent electrode having a first side over the organic light emitting layer.

6. The device of claim 5, further comprising:
   a first device electrical contact contacting a first side of the first electrode;
   a second device electrical contact contacting a second side of the second electrode;
   a sealing member over the second side of the second electrode;
   a mounting substrate over the sealing member; and
   a plurality of organic electroluminescent devices below the mounting substrate having a fill factor of greater than 0.3.

7. The device of claim 5, wherein:
   a reflectivity of a non-light emitting side of the device is 80% or higher;
   the output coupler optical thickness for scattering is about 0.1 to about 0.9; and
   the device emission extraction is 53% or higher.

8. The device of claim 7, wherein:
   a reflectivity of the first electrode is 86% or higher;
   the output coupler optical thickness for scattering is about 0.5; and
   the device emission extraction is 58% or higher.

9. An organic electroluminescent light emitting device, comprising:
   a first electrode;
   a second electrode;
   at least one organic light emitting layer; and
   a ceramic output coupler;
   wherein the device comprises an organic light emitting diode, the ceramic coupler comprises a ceramic layer containing a light emitting surface of the device, and the ceramic output coupler comprises a first ceramic material having surface recesses at grain boundaries and a second ceramic material in the recesses between the first ceramic material and an adjacent layer of the device.

10. An organic electroluminescent light emitting device, comprising:
    a first electrode;
    at least one organic light emitting layer over the first electrode;
    a second transparent electrode over the at least one organic light emitting layer; and
    a shaped ceramic material over the second transparent electrode, wherein:
    the shaped ceramic material contains a corrugated or dimpled light emitting surface and voids throughout its volume which scatter light emitted by the organic light emitting layer; and an index of refraction of the shaped ceramic material is matched to an index of refraction of an adjacent layer of the electroluminescent device.

11. The device of claim 10, wherein the index of refraction of the ceramic shaped ceramic material differs by 0.1 or less from the index of refraction of the adjacent layer of the electroluminescent device or of a transparent substrate.

12. The device of claim 11, wherein the dimples have a sinusoidal, pseudo-pyramidal or conical shape.

13. The device of claim 12, wherein the ceramic shaped ceramic material comprises $Al_2O_3$, $Y_2O_3$, $Y_3Al_5O_{12}$, $MgAl_2O_4$, MgAlON, AlN, AlON, or $TiO_2$ doped $ZrO_2$.

14. The device of claim 13, wherein the shaped ceramic material comprises a ceramic phosphor or a ceramic matrix material containing light emitting particles.

15. The device of claim 11, wherein the ceramic shaped ceramic material comprises:
    a first ceramic layer having a first index of refraction that is matched to an index of refraction of an adjacent layer of the electroluminescent device; and
    a second ceramic layer having a second index of refraction lower than the first index of refraction.

16. The device of claim 11, wherein:
    the electroluminescent device comprises an organic light emitting diode which emits white light;
    the first electrode comprises a metal containing electrode;
    the organic light emitting layer comprises at least one an organic molecule layer or at least one polymer layer over a first side of the first electrode;
    the second electrode comprises a transparent electrode having a first side over the organic light emitting layer; and
    the device further comprises a voltage source.

17. The device of claim 16, further comprising:
    a first device electrical contact contacting the first side of the first electrode, wherein the first electrode comprises aluminum, silver or gold;
    a second device electrical contact contacting a second side of the second electrode, wherein the second electrode comprises indium tin oxide;
    a sealing member over the second side of the second electrode;
    a mounting substrate over the sealing member; and
    a plurality of organic electroluminescent devices below the mounting substrate having a fill factor of greater than 0.3.

18. A method of making an organic electroluminescent light emitting device, comprising:
    forming a first electrode;
    forming at least one organic light emitting layer;
    forming a second electrode; and
    forming a ceramic output coupler;
    wherein the step of forming the ceramic output coupler comprises:
       placing a ceramic precursor material into a mold cavity;
       solidifying the precursor material to form a shaped ceramic output coupler having a corrugated or dimpled first light emitting surface; and
       attaching the output coupler to the organic electroluminescent light emitting device.

19. The method of claim 18, wherein the step of placing comprises injecting a viscous heated ceramic precursor into the mold cavity.

20. The method of claim 19, wherein the step of solidifying comprises cooling the precursor material in the mold cavity.

21. The method of claim 18, wherein the step of solidifying comprises die pressing a ceramic precursor powder into the output coupler in the mold cavity.

22. The method of claim 18, wherein the ceramic precursor material comprises a ceramic precursor powder and a binder.

23. The method of claim 22, further comprising sintering the solidified precursor material until the material has a porosity of 0.1% or less and a transmittance of 95% or more.

24. The method of claim 23, further comprising heating the precursor material to evaporate the binder.

25. The method of claim 23, further comprising selecting the sintering conditions, precursor powder composition and precursor powder size to form a ceramic output coupler whose the index of refraction differs by 0.1 or less from the index of refraction of the adjacent layer of the electroluminescent device and which contains voids which randomly scatter light emitted by the organic light emitting layer.

26. The device of claim 25, wherein the ceramic output coupler material comprises $Al_2O_3$, $Y_2O_3$, $Y_3Al_5O_{12}$, $MgAl_2O_4$, MgAlON, AlN, AlON, or $TiO_2$ doped $ZrO_2$.

27. A method of making an organic electroluminescent light emitting device, comprising:

forming a first electrode;

forming at least one organic light emitting layer;

forming a second electrode; and forming a ceramic output coupler;

wherein the ceramic output coupler comprises a ceramic phosphor or a ceramic matrix material containing light emitting particles.

28. A method of making an organic electroluminescent light emitting device, comprising:

forming a first electrode;

forming at least one organic light emitting layer;

forming a second electrode; and forming a ceramic output coupler;

wherein the ceramic output coupler comprises:

a first ceramic layer having a first index of refraction that is matched to an index of refraction of an adjacent layer of the electroluminescent device; and a second ceramic layer having a second index of refraction lower than the first index of refraction.

29. A method of making an organic electroluminescent light emitting device, comprising:

forming a first electrode;

forming at least one organic light emitting layer;

forming a second electrode; and forming a ceramic output coupler;

wherein the method further comprises forming a second ceramic material in surface recesses at grain boundaries of the ceramic output coupler by a sol-gel method.

30. A method of making an organic electroluminescent light emitting device, comprising:

forming a first electrode;

forming at least one organic light emitting layer;

forming a second electrode; and forming a ceramic output coupler;

wherein the method further comprises:

forming a glass plate over the first electrode;

forming a metal coating over the glass plate; and attaching the organic electroluminescent light emitting device to a mounting substrate.

31. The method of claim 30, further comprising attaching a plurality of organic electroluminescent light emitting devices to the mounting substrate such that the devices have a fill factor of greater than 0.3.

* * * * *